United States Patent [19]
Sato et al.

[11] Patent Number: 5,728,601
[45] Date of Patent: Mar. 17, 1998

[54] PROCESS FOR MANUFACTURING A SINGLE IN-LINE PACKAGE FOR SURFACE MOUNTING

[75] Inventors: Mitsutaka Sato; Masanori Yoshimoto, both of Kawasaki, Japan

[73] Assignee: Fujitsu Limited, Kawasaki, Japan

[21] Appl. No.: 441,595

[22] Filed: May 15, 1995

Related U.S. Application Data

[62] Division of Ser. No. 26,809, Mar. 5, 1993, Pat. No. 5,446,317.

[30] Foreign Application Priority Data

Mar. 9, 1992 [JP] Japan ..................... 4-050941

[51] Int. Cl.⁶ ..................... H01L 21/56; H01L 21/58; H01L 21/60
[52] U.S. Cl. ..................... 437/208; 437/211; 437/217
[58] Field of Search ..................... 437/211, 217, 437/208, 915; 257/696, 678, 701, 733, 731, 732; 361/772, 783, 807

[56] References Cited

U.S. PATENT DOCUMENTS

| | | | |
|---|---|---|---|
| Re. 34,794 | 11/1994 | Farnworth | 257/678 |
| 2,734,151 | 2/1956 | Jacobs | 361/776 |
| 4,764,846 | 8/1988 | Go | 361/388 |
| 4,975,763 | 12/1990 | Baudouin et al. | 257/701 |
| 5,204,287 | 4/1993 | McLellan et al. | 257/676 |
| 5,260,601 | 11/1993 | Baudouin et al. | 257/733 |
| 5,275,975 | 1/1994 | Baudouin et al. | 437/209 |
| 5,413,970 | 5/1995 | Russell | 437/217 |
| 5,451,815 | 9/1995 | Taniguchi et al. | 257/731 |

FOREIGN PATENT DOCUMENTS

| | | | |
|---|---|---|---|
| 333374 | 9/1989 | European Pat. Off. | 257/733 |
| 61-174656 | 8/1986 | Japan . | |
| 62-076659 | 4/1987 | Japan . | |
| 01-166545 | 6/1989 | Japan . | |

*Primary Examiner*—David Graybill
*Attorney, Agent, or Firm*—Staas & Halsey

[57] ABSTRACT

A process for manufacturing semiconductor package of a single in-line type including a semiconductor chip, a package body for accommodating the semiconductor chip and a plurality of leads held by the package body to extend substantially perpendicularly to a bottom edge surface of the package body. The package body carries a cutout part at a predetermined position of a side edge that surrounds the package body such that the cutout part is adapted for engagement with a support leg for supporting the package body substantially upright on a substrate.

12 Claims, 8 Drawing Sheets

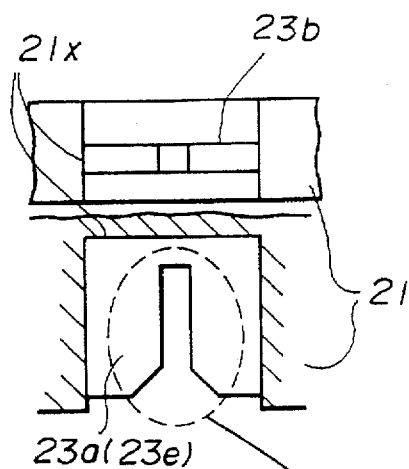
FIG.6(A)
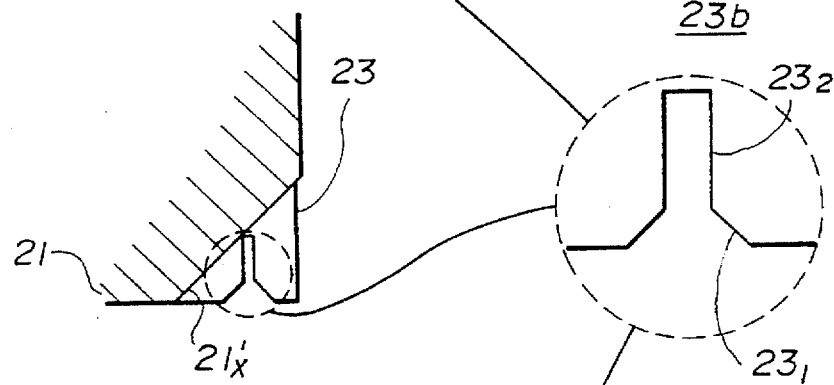
FIG.6(B)
FIG.6(D)
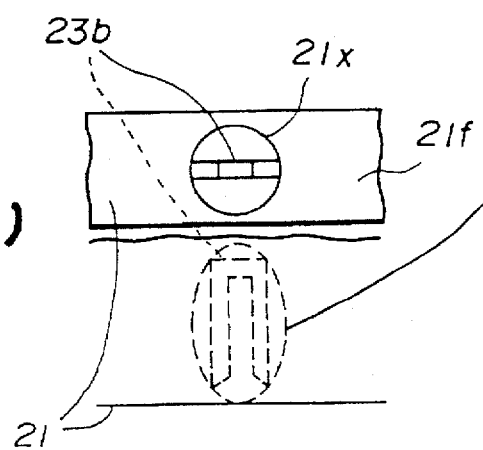
FIG.6(C)

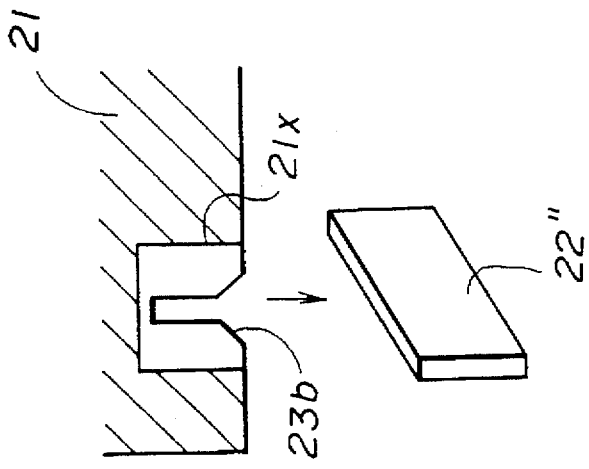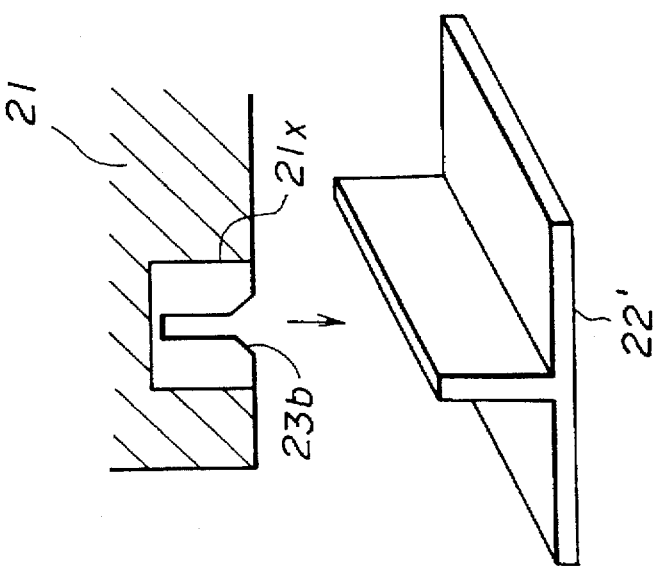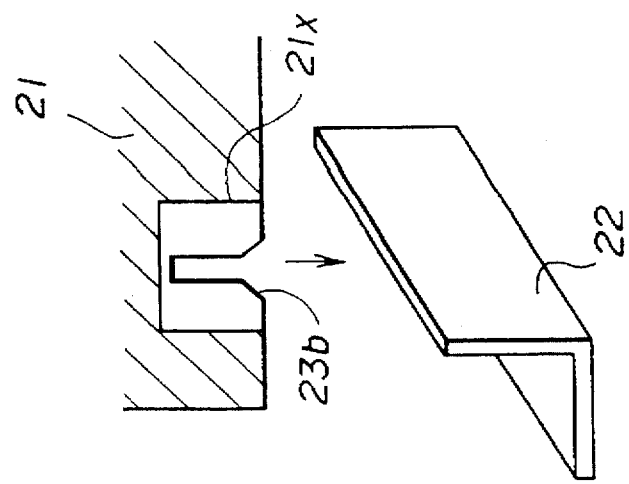

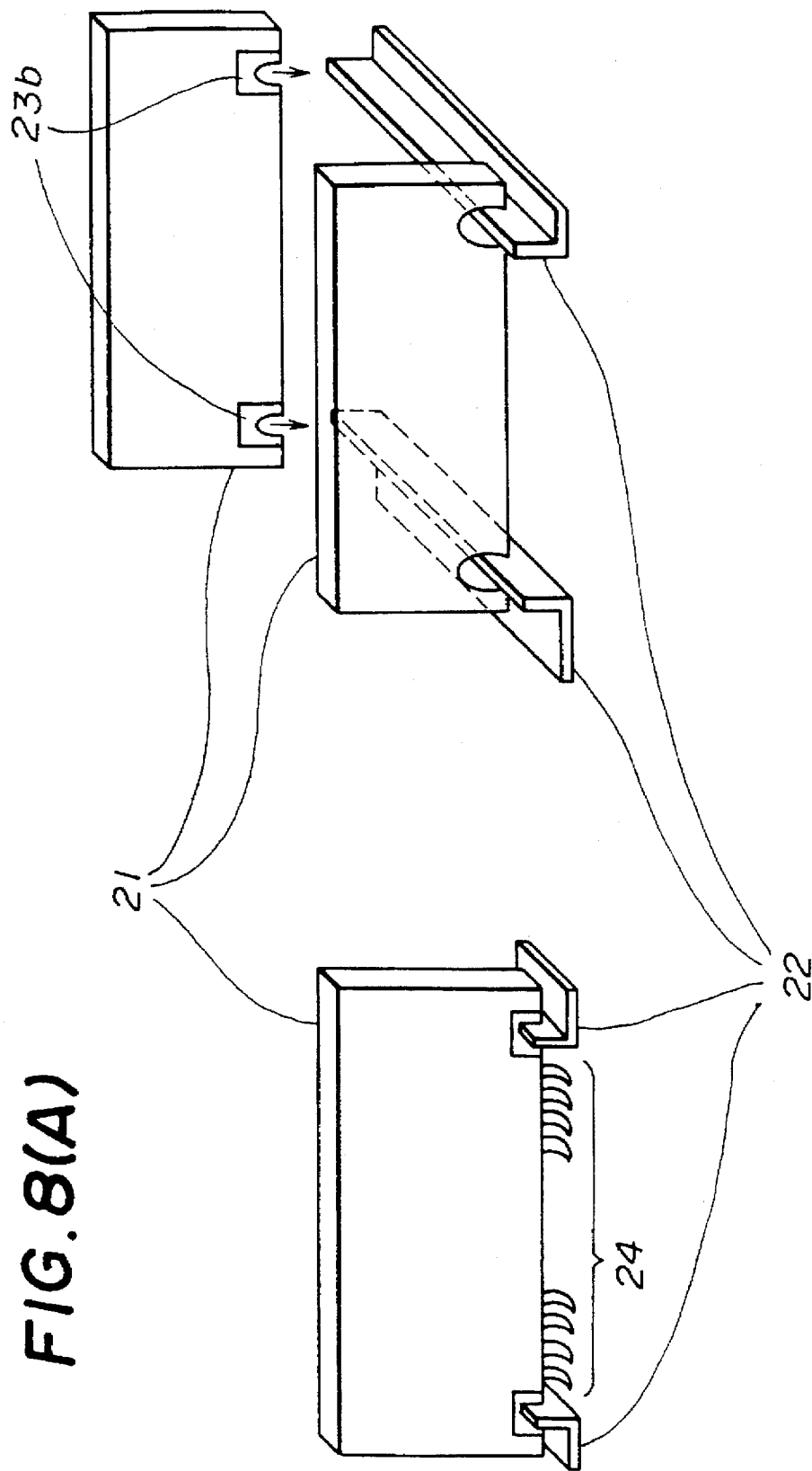

PROCESS FOR MANUFACTURING A SINGLE IN-LINE PACKAGE FOR SURFACE MOUNTING

This application is a division of application Ser. No. 08/026,809, filed Mar. 5, 1993, now U.S. Pat. No. 5,446,317.

BACKGROUND OF THE INVENTION

The present invention generally relates to semiconductor devices and more particularly to a semiconductor package that has a single in-line package structure.

In order to improve the efficiency of mounting of semiconductor devices on a support substrate such as a printed circuit board, a package structure designed for surface mounting is used extensively. By using the surface mounting technology, the semiconductor device can be mounted on the circuit board without providing holes for inserting leads of the device. The soldering of the leads is achieved by merely placing the device on the circuit board and passing the device and the circuit board through a heating furnace for causing a reflow of soldering alloy. Thereby, the efficiency of the mounting process is improved significantly and the fabrication cost of electronic apparatuses that use the semiconductor devices is significantly reduced.

In order to mount the semiconductor devices as many as possible on a single support substrate, a so-called single in-line package (SIP) is proposed. In the single in-line package, the leads are provided along a single edge of a flat package body to extend perpendicularly with respect to the edge thereof, and the package body is held upright on the substrate by inserting the leads into the corresponding holes of the substrate. As the package body is held vertically on the substrate, one can increase the number of the packages that are mounted on the single substrate. Further, such a structure is advantageous for cooling the device.

In order to combine the advantageous feature of the single in-line package with the advantageous feature of the surface mounting technology, a package structure shown in FIG. 1 is proposed in the U.S. Pat. No. 4,975,763.

Referring to FIG. 1, the package designated by a numeral 1 includes a flat resin package body 2 that accommodates therein a semiconductor chip 3. At an edge 2a of the flat package body 2, there are provided a number of leads each having an inner lead part 4a connected to a bonding pad of the chip 3 and an outer lead part 4b extending outward from the edge 2a. Further, the outer lead part 4b of the leads 4 is bent laterally with respect to the extending direction of the leads 4. In order to support the package body 2 on the substrate at the time of mounting, there is provided a pair of studs 5a each including a stop portion 6 and a cylindrical clip portion 7 of a reduced diameter for inserting into a corresponding hole provided on the substrate.

FIG. 2 shows the mounting of the package 1 on a substrate 8, wherein the substrate 8 is formed with a hole 8a for holding the clip portion 7 of the stud 5. There, the portion 7 is inserted into the hole 8a as shown in FIG. 2 and the package body 2 is held upright on the substrate 8. The substrate 8 carries thereon a conductor pattern 8b for wiring, and the lead 4 is contacted with the conductor pattern 8b when the package 1 is held on the substrate 8. By passing the substrate 8 together with the package 1 in the state shown in FIG. 2 through a furnace, the soldering alloy provided on the conductor pattern 8b causes a reflow and the lead 4 is soldered firmly upon the conductor pattern 8.

In this conventional package structure, there is a problem in that one has to provide the hole 8a on the substrate 8 in correspondence to the stud 5 for holding the package body 2 on the substrate 8. As each lead 4 has to engage with corresponding pattern 8b when the package is mounted, it is necessary that the hole 8a be formed with high precision. This requirement is particularly acute in the recent semiconductor devices that have a large number of leads on the package body. The high precision required by this formation of the hole and the insertion of the stud into the hole undermine the advantageous feature of the surface mounting technology, and the efficiency of mounting is inevitably deteriorated.

The package of FIG. 1 has another drawback in that each lead 4 has to extend straight from the package body 2 at least for a distance corresponding to the length of the stop portion 6. This straight part of the lead 4 contributes to nothing but causes an unwanted delay of the electrical signals that is carried therethrough. With the increasing operational speed of the semiconductor devices, such a delay may cause a serious problem in the exchange of electric signals between the chip and the conductor pattern on the substrate. Further, such a structure having a long, exposed lead is vulnerable to external noises. As long as one uses the stud for supporting the package body on the substrate, one cannot reduce the length of the lead satisfactorily.

In order to eliminate the problem pertinent to the conventional package of FIG. 1, another single in-line package structure is proposed in the U.S. patent application Ser. No. 881,899 filed May 12, 1992.

FIG. 3 shows the bottom view of the package proposed in the foregoing U.S. '899 application.

Referring to FIG. 3, the single in-line type package includes a semiconductor chip not shown in the illustration and a package body 11 that accommodates the semiconductor chip therein. The package body 11 is defined by a pair of opposing major surfaces 11a and 11b and surrounded by a side wall 11d, 11e connecting the two opposing major surfaces 11a and 11b, wherein the side wall includes a substantially straight bottom edge part 11f that extends substantially straight, when viewed in the direction perpendicular to the major surfaces 11a and 11b. A plurality of leads 14 are held by the package body 11 to extend substantially perpendicularly to the edge surface.

Each of the leads 14 is connected to the semiconductor chip electrically, wherein each lead consists of an inner lead part located inside the package body and an outer lead part 14a located outside the package body. There, outer lead part 14a is bent laterally at a boundary between the inner part and the outer part. The leads are bent in one of a first and second direction such that they are opposite from their adjacent leads and substantially perpendicular to the opposing major surfaces. In addition, the package of FIG. 3 includes a plurality of support legs 12a, 12b, 13a and 13b held by the package body 11 to extend substantially perpendicularly to the edge surface 11f, wherein each of the support legs consists of an inner part located inside the package body and an outer part located outside the package body. There, the outer part of the support leg such as the leg 12a is bent laterally in one of the first and second directions at a boundary between the inner part and the outer part such that the package body is held upright when placed on a substrate.

According to the foregoing construction of FIG. 3, the package body 11 is held upright on the substrate by the support legs by simply placing the package body 11 on a substrate such as a printed circuit board. By causing a reflow of a solder alloy in this state, each interconnection lead is connected electrically to a corresponding conductor pattern on the substrate. In other words, the semiconductor package can be mounted on the substrate by the surface mounting technology. Thereby, one can eliminate the process for inserting a stud into a corresponding hole of the substrate as practiced in the conventional device shown in FIG. 1. Associated therewith, one can eliminate the process for forming the holes accurately in the substrate. Thereby, the efficiency of mounting the package on the substrate is significantly improved. The package structure of FIG. 3 has another advantageous feature in that the interconnection lead 14 is bent laterally at the root part where it emerges from the package body 11. Thereby, the unnecessary extension of the leads is eliminated and the delay of the electric signals hitherto caused by such a straight part of the lead at the outside of the package body is eliminated. Without the lead extensions the semiconductor device is less vulnerable to external noises. Obviously, this advantageous feature is obtained as a result of use the support legs 12a, 12b, 13a and 13b that are also bent at the root part.

In spite of various advantageous features described above, the package of FIG. 3 still has a drawback in that laterally extending support legs tend to cause an interference with adjacent packages when the packages are mounted with a reduced mutual separation. Thus, one has to secure a relatively large distance between adjacent package bodies when a number of packages are mounted on a common substrate. Unfortunately, such a situation occurs relatively frequently when mounting memory devices on a mother board of computers. Further, because of the limited allowable lateral length of the support legs, the package of FIG. 3 has a substantial risk that the package body may fall due to blowing of a hot air for causing the reflow of the solder alloy.

SUMMARY OF THE INVENTION

Accordingly, it is a general object of the present invention to provide a novel and useful semiconductor package wherein the foregoing problems are eliminated.

Another and more specific object of the present invention is to provide a single in-line package for semiconductor devices suitable for surface mounting with a reduced mutual separation.

Another object of the present invention is to provide a semiconductor device having a package of a single in-line type, comprising: a semiconductor chip; a package body that accommodates said semiconductor chip therein, said package body being defined by a pair of opposing major surfaces and surrounded by a side wall connecting said pair of opposing major surfaces, said side wall including a bottom edge part that extends substantially straight, when viewed in a direction perpendicular to said major surfaces, to form a substantially straight bottom edge surface; and a plurality of leads held by said package body to extend substantially perpendicularly to said bottom edge surface, each of said leads being connected to said semiconductor chip electrically, each of said leads consisting of an inner part located inside said package body and an outer lead part located outside said package body, said outer lead part being bent laterally at a boundary between said inner part and outer part, in one of first and second directions such that adjacent leads are opposite from each other and substantially perpendicular to said opposing major surfaces; said package body carrying a cutout part at a predetermined position of said side wall, said cutout part being adapted for engagement with a support leg part for supporting said package body substantially upright on a substrate.

Another object of the present invention is to provide a semiconductor package assembly, comprising: one or more packages of a single in-line type, each of said plurality of packages comprising: a semiconductor chip; a package body that accommodates said semiconductor chip therein, said package body being defined by a pair of opposing major surfaces and surrounded by a side wall connecting said pair of opposing major surfaces, said side wall including an edge part that extends substantially straight, when viewed in a direction perpendicular to said major surfaces, to form a substantially planar edge surface; and a plurality of leads held by said package body to extend substantially perpendicularly to said edge surface, each of said leads being connected to said semiconductor chip electrically, each of said leads consisting of an inner part located inside said package body and an outer lead part located outside said package body, said outer lead part being bent laterally at a boundary between said inner part and outer part, in one of first and second directions such that adjacent leads are opposite from each other and substantially perpendicular to said opposing major surfaces; said package body carrying a cutout part at a predetermined position of said side wall, said cutout part being adapted for engagement with a support leg means for supporting said package body substantially upright on a substrate; and support leg means provided commonly to said plurality of packages such that said support leg means is accommodated into said cutout part, said support leg means supporting said plurality of said packages substantially upright upon a common substrate.

Another object of the present invention is to provide a process for mounting a semiconductor package on a substrate, comprising the steps of: mounting a support member on a semiconductor package body, said support member being adapted for holding said package body substantially upright when placed upon a substrate; placing said package member carrying therewith said support member, on a substrate; and causing a reflow of a solder pattern provided on said substrate to establish a firm mechanical and electrical contact between said solder pattern and interconnection leads provided on said package body.

According to the present invention, one can mount a number of semiconductor packages on a common substrate with a reduced mutual separation, by using the surface mounting technology. Thereby, the efficiency of utilization of the surface area of the substrate is improved substantially, together with the improvement in the efficiency for the mounting process that is achieved as a result of the surface mounting technology.

BRIEF DESCRIPTION OF THE DRAWINGS

FIGS. 7(A)–7(C) are diagrams showing various modifications of the first embodiment;

DETAILED DESCRIPTION OF THE PREFERRED EMBODIMENTS

Figure 4:
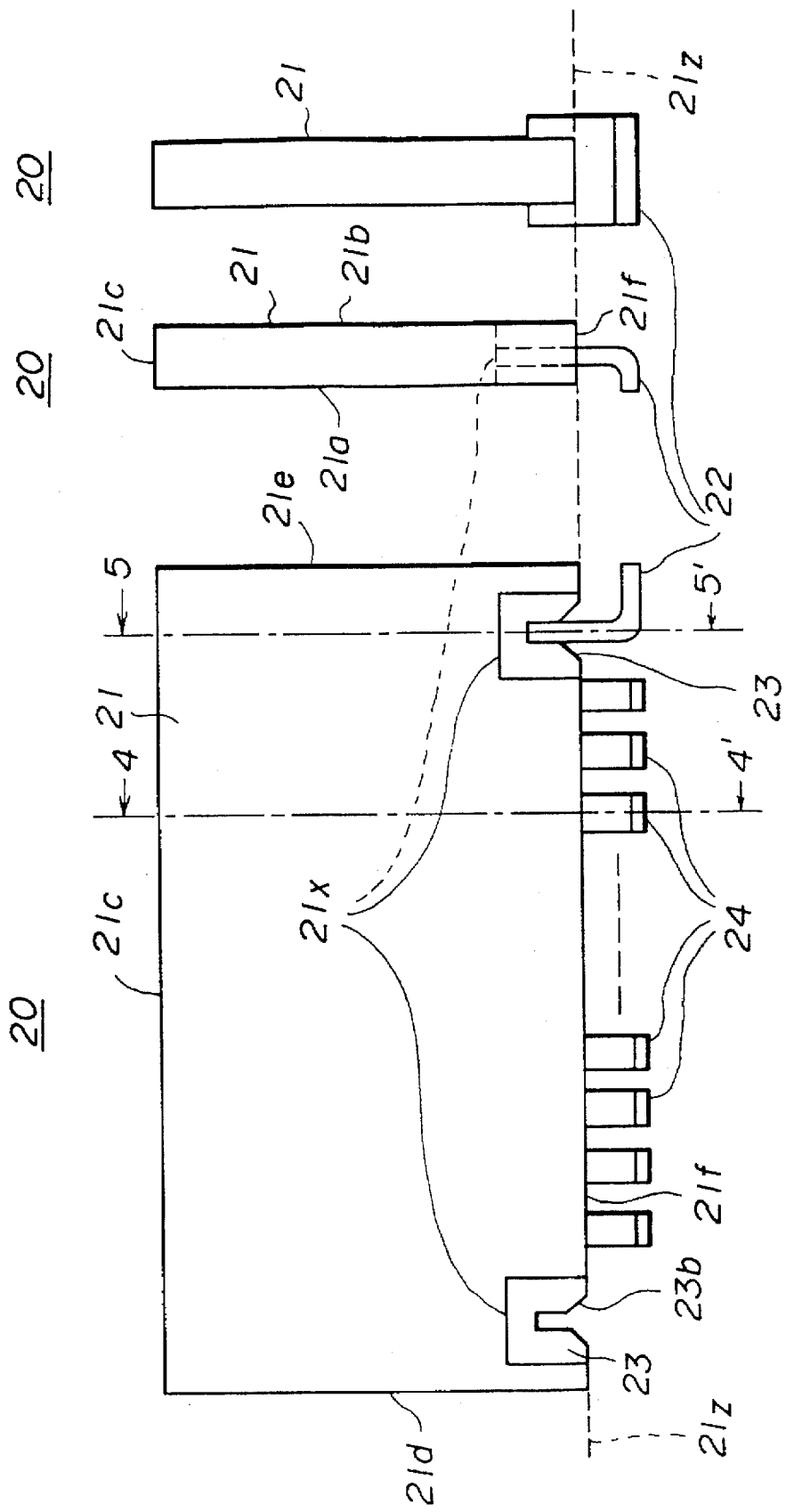
FIGS. 4(A)–4(C) are diagrams showing the semiconductor package according to a first embodiment of the present invention.

FIGS. 4(A)–4(C) show a semiconductor package 20 according to a first embodiment of the present invention.

Referring to the drawings, the semiconductor package 20 includes a resin package body 21 that is defined laterally by a pair of opposing major surfaces 21a and 21b. Further, the major surfaces 21a and 21b are separated from each other by a side wall that includes a top edge 21c and an opposing bottom edge 21f, as well as two mutually opposing side edges 21d and 21e. There, the edges 21c–21f surround the package body 21, and it will be noted that at least the bottom edge 21f extends generally parallel to the flat upper major surface of a substrate (not shown in FIGS. 4(A)–4(C)) on which the package body is going to be placed by the surface mounting technology. In correspondence to the bottom edge 21f, a number of interconnection leads protrudes from the package body 21, and the tip end of the interconnection lead is bent laterally for engagement with a conductor pattern provided on the substrate that may be a printed circuit board.

Figure 1:
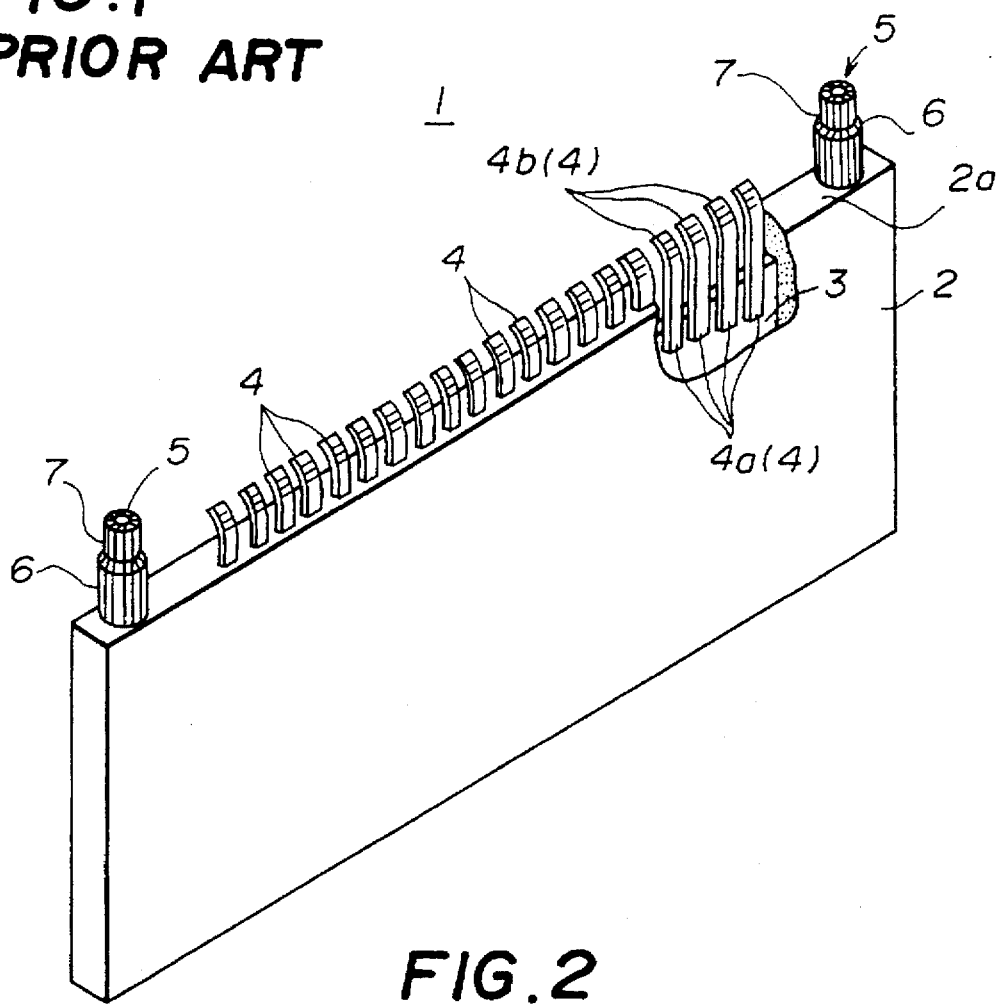
FIG. 1 is a diagram showing a conventional single in-line package designed for surface mounting technology in a perspective view.
Figure 2:
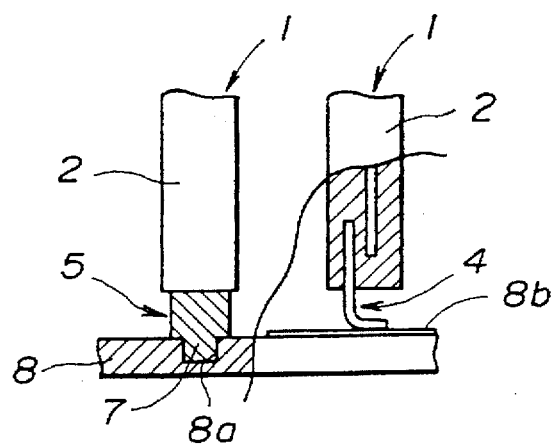
FIG. 2 is a diagram showing the mounting of the package on a substrate.
Figure 3:
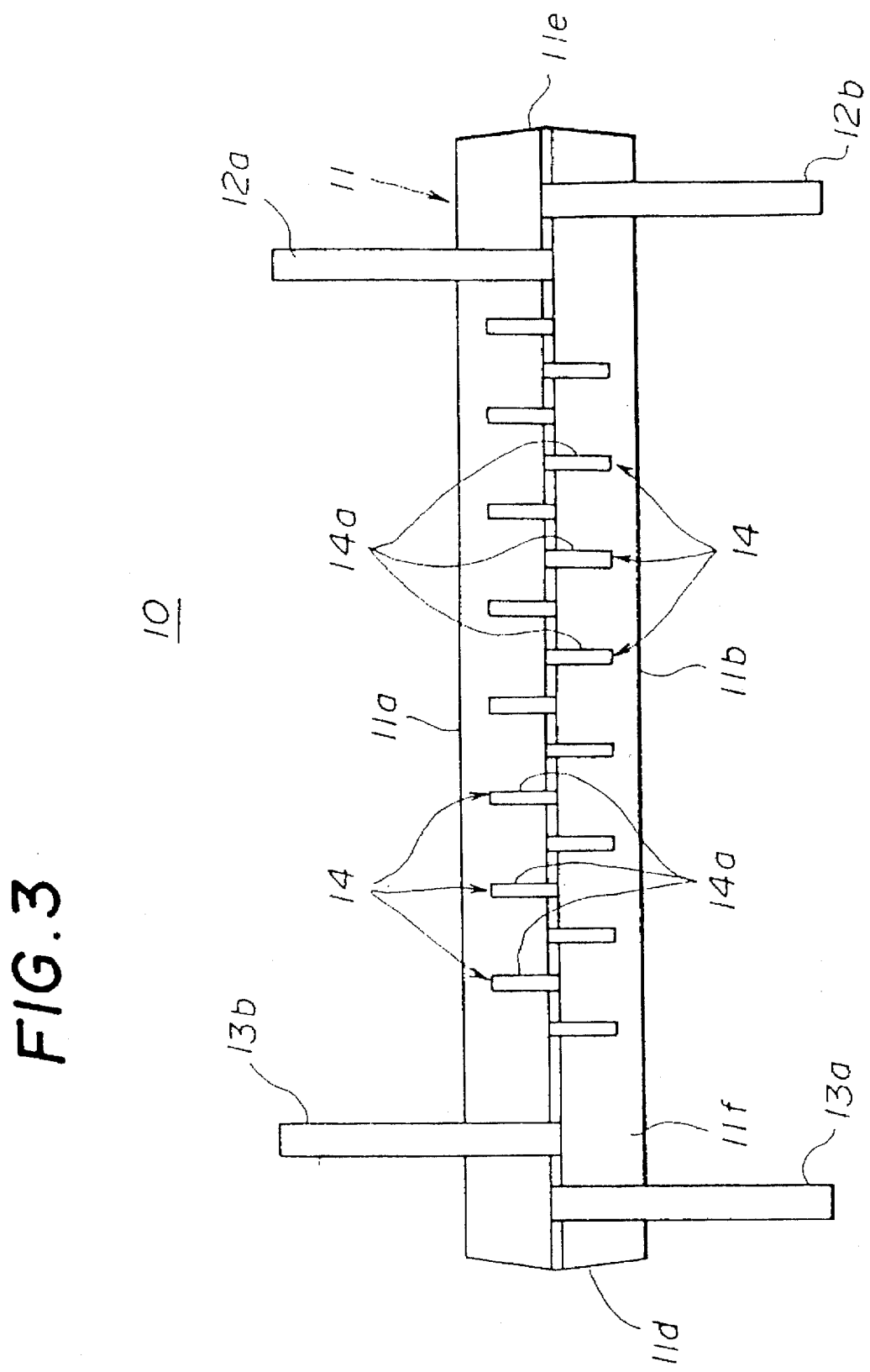
FIG. 3 is a diagram showing another conventional single in-line package in a bottom view

In the package 20 of FIG. 4(A), the resin package body 21 is formed with a cutout region 21x in correspondence to the bottom edge 21f to expose a lead frame 23, wherein the lead frame 23 is embedded in the package body 21 for supporting a semiconductor chip thereon (see FIG. 5 to be described later). Further, the exposed part of the lead frame 23 is provided with a cutout 23b for engagement with a support leg member 22 as illustrated in FIGS. 4(A)14 4(C). There, FIG. 4(B) shows the cross section of FIG. 4(A) taken along a line 4–4' while FIG. 4(C) shows the cross section taken along a line 5–5'. As will be noted in FIG. 4(A), the support leg 22 is formed of an L-shaped member having a leg part bent approximately parallel to the bottom edge 21f for engagement with the surface of the substrate. On the other hand, it will be noted from FIG. 4(C) that the support leg 22 has a limited lateral size in the direction perpendicular to the major surfaces 21a and 21b of the package body 21. Thereby, one can avoid the problems of the support legs 22 causing an interference as in the case of the package of FIG. 3, particularly when the distance between the packages is reduced.

In the structure of FIGS. 4(A)–4(C), it should be noted that the lower edge of the exposed lead frame 23 at the level 21z substantially coincides with the lower edge of the package body 21.

Figure 5:
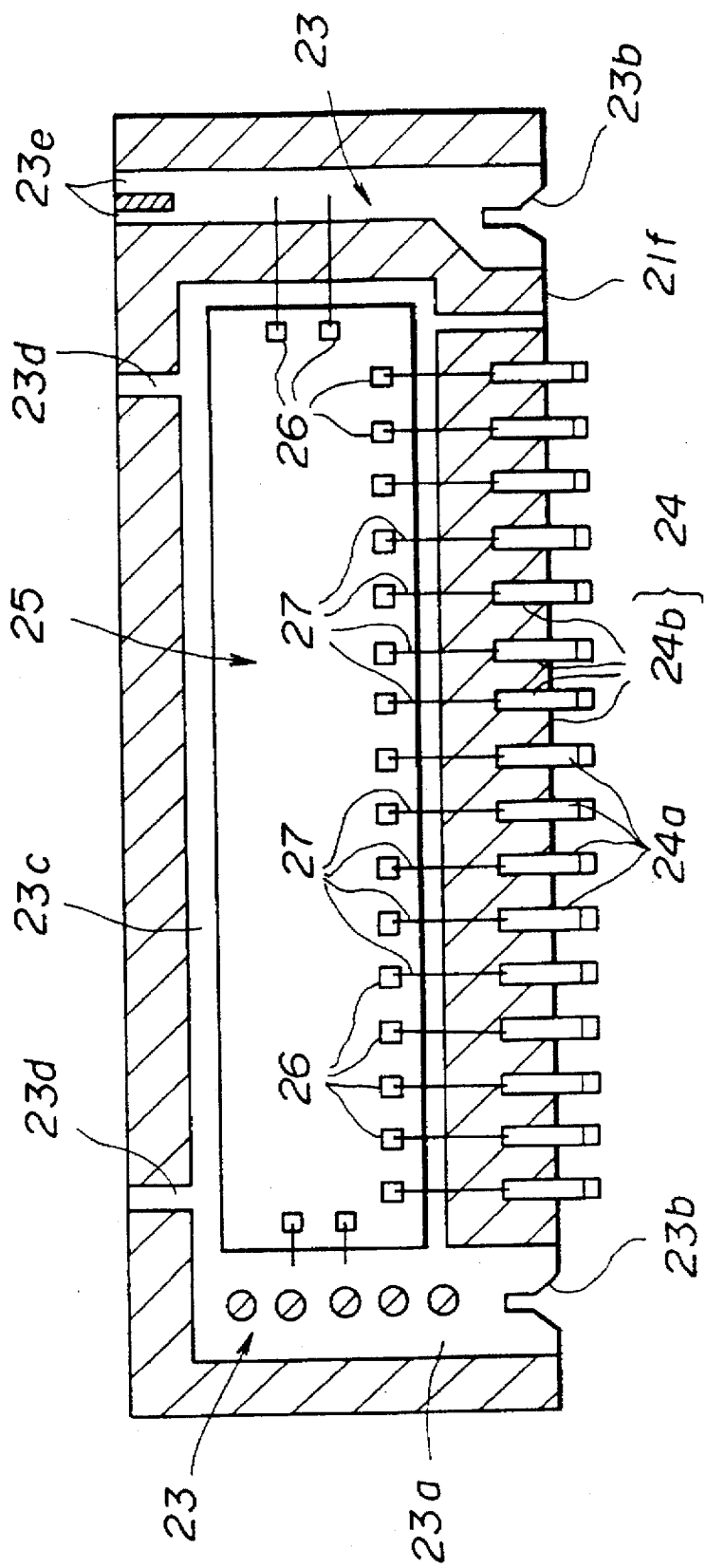
FIG. 5 is a diagram showing the interior of the semiconductor package of the first embodiment of the present invention.

FIG. 5 shows the internal structure of the semiconductor package 20.

Referring to FIG. 5, the semiconductor device includes the lead frame 23 described briefly with reference to FIG. 4(A), wherein the lead frame 23 is formed of a first lead frame part 23a and a second lead frame part 23e both embedded in the resin package body 21. As shown in FIG. 5, the lead frame part 23a is formed with the cutout 23b adjacent the cutout 21x of the resin package body 21. Similarly, the second lead frame part 23e includes a similar cutout represented also by the numeral 23b adjacent the cutout 21x of the resin package body 21.

The lead frame 23 further includes a stage part 23c for supporting the semiconductor chip 25 thereon. In the illustrated example, the stage part 23c has an elongated rectangular form in correspondence to an elongated rectangular form of the chip 25. In correspondence to the stage part 23c, the package body 21 also has an elongated rectangular form.

The semiconductor chip 25 has a number of bonding pads 26 formed along a lower edge of the chip when mounted on the lead frame 23, and each bonding pad 26 is connected to a corresponding lead 24 by a bonding wire 27. Typically, an Au wire is used for the bonding wire 27, wherein the wire 27 is bonded at an inner lead part 24b of the lead as usual. Further, some of the bonding pads 26 may be connected to the lead frame parts 23a and 23e for the ground connection. In this case, the support leg 22 is placed on the substrate in correspondence to a ground pattern.

In fabrication, a single lead frame that corresponds to the lead frame 23 and includes therein the lead frame part 23a; and the lead frame part 23b is used, and the semiconductor chip 25 is mounted on such a lead frame 23 at a part that corresponds to the stage part 23c. Thereby, the original lead frame 23 includes openings that correspond to the two cutouts 23a and 23b. Next, the bonding wires 27 are provided for connecting the bonding pads 26 and the corresponding leads 24, and a resin package body 21 is formed by a molding process such that the package body 21 encapsulates the lead frame 23 as well as the semiconductor chip 25 therein. After the package body 21 is thus formed, the lead frame 23 is cut to form the separated lead frame parts 23a and 23e. Thereby, the foregoing two cutouts 23b are formed as explained previously. Simultaneously, the interconnection leads 24 are formed. After the cutting process, the outer lead part 14a of the lead 14 is bent laterally for engagement with the conductor pattern on the substrate.

Figure 6A:
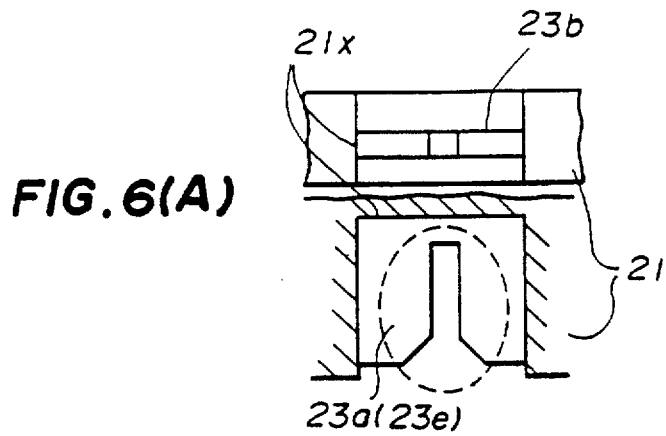
FIGS. 6(A)–6(D) are diagrams showing various modifications of the first embodiment.
Figure 6B:
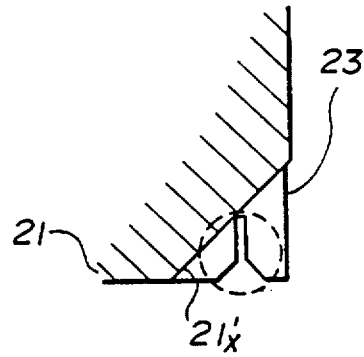
Figure 6D:
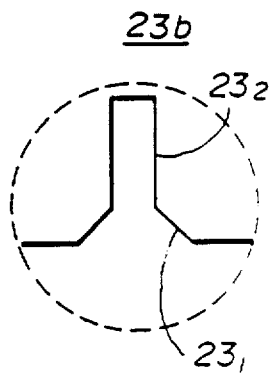
Figure 6C:
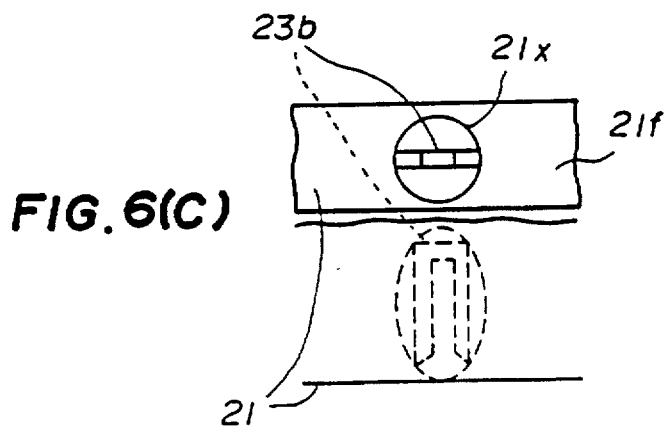

FIGS. 6(A)–6(C) show various examples of the cutout 23b, wherein FIG. 6(A) shows the cutout 23b corresponding to the embodiment of FIG. 4(A) and FIG. 5.

In FIG. 6(A), the upper illustration represents the bottom view of the cutout region 21x of the package body 21 in an enlarged scale while the lower illustration represents the side view of the cutout region 21x.

FIG. 6(B) shows a modification of the first embodiment, wherein a cutout region 21x' is formed at the corner of the package body 21. In this embodiment. too, one can provide a support leg in correspondence to the cutout 23b formed in the exposed part of the lead frame 23.

FIG. 6(C) shows another modification of the first embodiment, wherein a hole 21x is formed in correspondence to the bottom surface 21f of the package body 21 to penetrate into the package body, and the lead frame 23 carrying the cutout 23b is exposed in correspondence to the hole 21x.

FIG. 6(D) shows the cutout 23b in detail, wherein it will be noted that the cutout 23b includes a chamfer $23_1$ for facilitating the insertion of the support leg 22 and a groove $23_2$ formed in continuation to the chamber $23_1$ for holding the support leg 22 firmly. Thereby, the mounting of the leg 22 is substantially facilitated.

FIGS. 7(A)–7(C) show various modifications of the support leg 22 that may be used in combination with the cutout 23b exposed in correspondence to the package 20 of the first embodiment. Referring to the drawings, FIG. 7(A) shows use of a support leg member 22 having an L-shaped cross section, while FIG. 7(B) shows use of a support leg member 22' having a T-shaped cross section. Further, FIG. 7(C) shows use of a support leg member 22" that has a rectangular cross section. Any of these support leg members can be used for supporting the package body 21 of the present embodiment upright on the surface of the substrate.

Figure 8B:
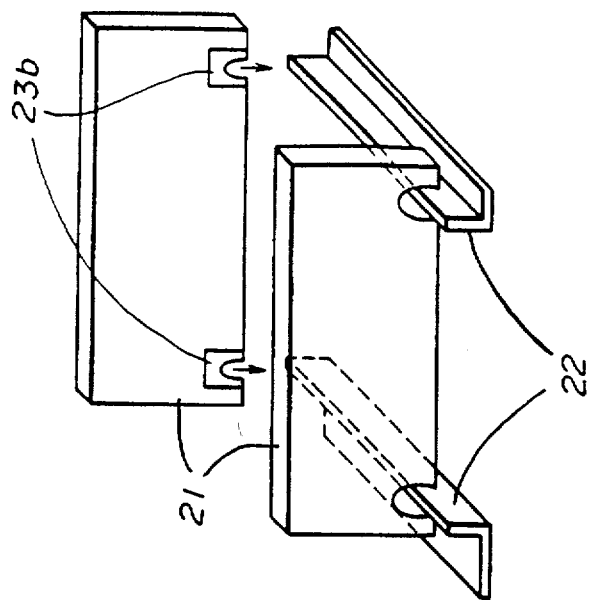
FIGS. 8(A) and 8(B) are diagrams showing a second embodiment of the present invention.
Figure 8A:
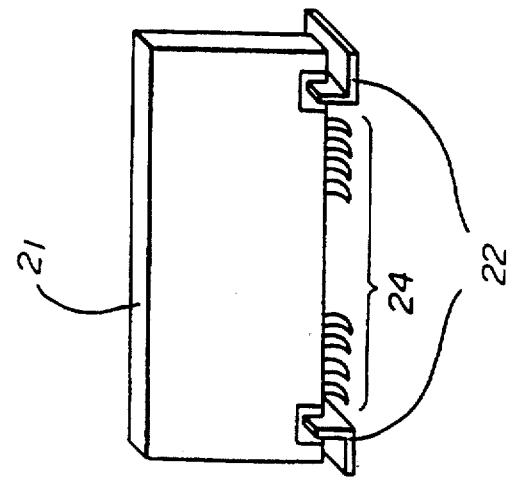

FIGS. 8(A) shows the semiconductor package 20 of the first embodiment in the perspective view wherein a single package body 21 is held on the support leg 22, while FIG. 8(B) shows a second embodiment of the present invention wherein a number of the package bodies 21 are held commonly-on a support leg 22. In the illustrated example, the support leg 22 has an L-shaped cross section in correspondence to the example of FIG. 7(A) and extends with a substantial length such that a number of package bodies 21 are held thereon with a reduced mutual separation. By configuring the semiconductor assembly as such, it is possible to support the package bodies upright on the substrate such as printed circuit board with an improved mechanical stability as compared with the embodiment of FIG. 8(A).

Figure 9:
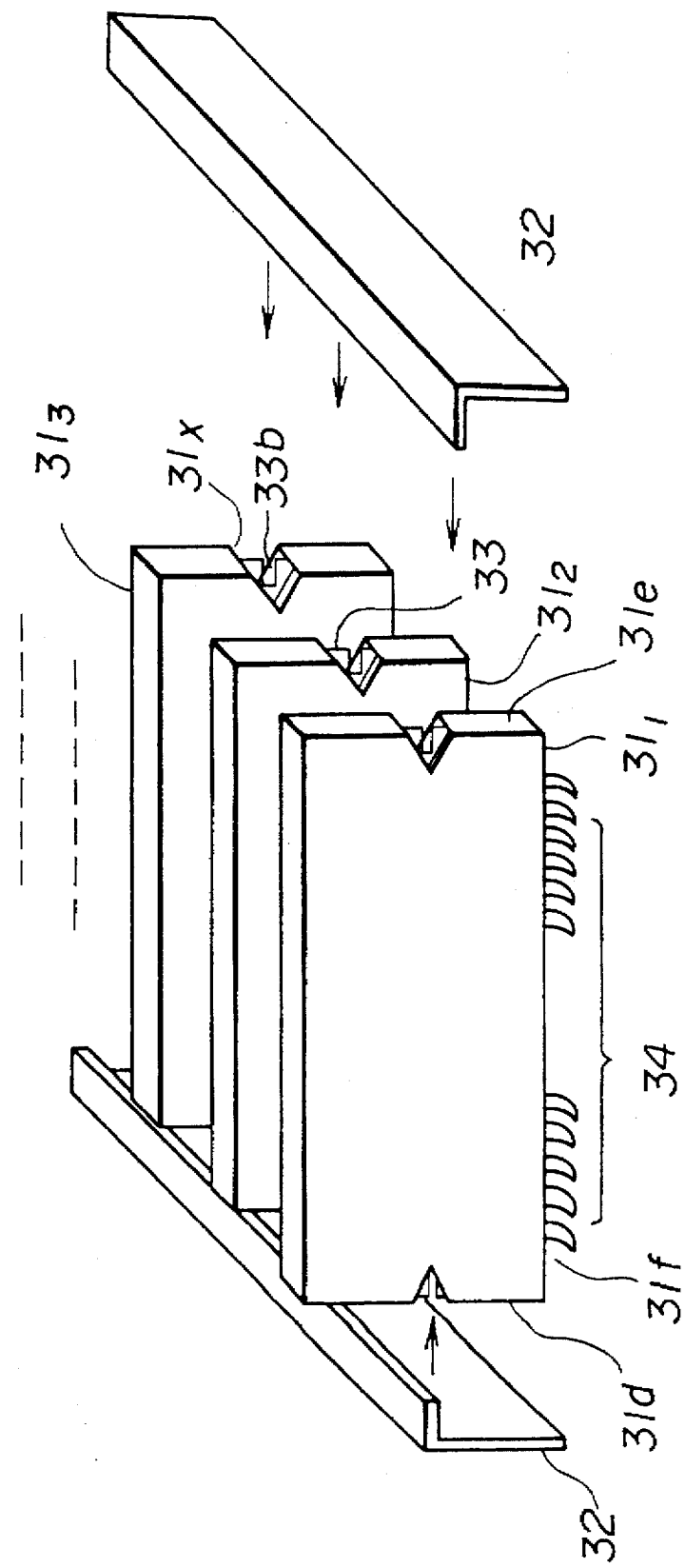
FIG. 9 is a diagram showing a third embodiment of the present invention.

FIG. 9 shows a third embodiment of the present invention, wherein a number of package bodies $31_1$–$31_3$ are held adjacent to and parallel with each other with a reduced mutual separation. There, each package body such as the package body $31_1$ has a construction substantially identical with the package body 21, except that the package body $31_1$ is formed with a cutout $31_x$ for exposing a lead frame 33 that corresponds to the lead frame 23 of the previous embodiment, on both side walls 31d and 31e rather than at the bottom edge 31f. It should be noted that the side walls 31d and 31e correspond to the side walls 21d and 21e of the previous embodiment, while the bottom edge 31f corresponds to the bottom edge 21f.

There, the exposed part of the lead frame 33 carries a cutout 33b corresponding to the cutout 23b, and a pair of L-shaped rails 32 are engaged into the cutout 23b from both sides of the package bodies $31_1$–$31_3$ as indicated by arrows, as the support leg. Thereby, the package bodies $31_1$–$31_3$ are held upright on the substrate such as a printed circuit board with a reduced mutual separation and improved mechanical stability. Further, the construction of FIG. 9 that eliminates the engagement of the support leg 32 with the bottom edge of the package body 31, enables a minimization in the straight portion of the outer lead part of the interconnection leads 34. In other words, it is possible to configure the outer lead part of the leads 34 to be bent laterally immediately upon emerging from the package body such as the package body $31_1$. Thereby, the delay in the signals traveling through the leads 34 can be minimized. Further, the risk that external noises are picked up at such an extraneous straight portion of the interconnection leads 34 is minimized.

In the foregoing construction of the present invention, it should be noted that the support legs 22 or 32 are engaged directly to the lead frame 23 or 33 that is embedded in the resin package body for supporting a semiconductor chip such as the chip 25. Thereby, the heat produced at the semiconductor chip 25 is dissipated easily via the support legs 22 to the printed circuit board, and one can obtain a cooling effect substantially comparable to the cooling effect that is obtained when a cooling fin is provided on the semiconductor chip. For this purpose, it is preferable to form the support legs 22 or 32 by an excellent heat conductor such as the Ni—Fe alloy that is the same material used for the lead frame.

Once the semiconductor package or package assembly is mounted upon the substrate such as a printed circuit board, the reflowing of solder alloy is caused by applying a hot air to the substrate. Alternatively, one may cause the printed circuit board thus carrying thereon the package or package assembly in a furnace to cause the desired reflowing.

Further, the present invention is not limited to the embodiments described heretofore, but various variations and modifications may be made without departing from the scope of the invention.

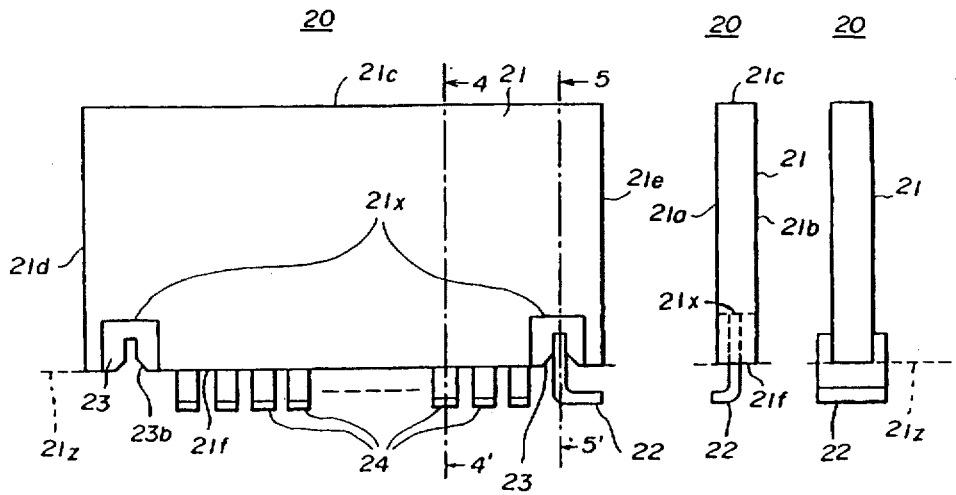

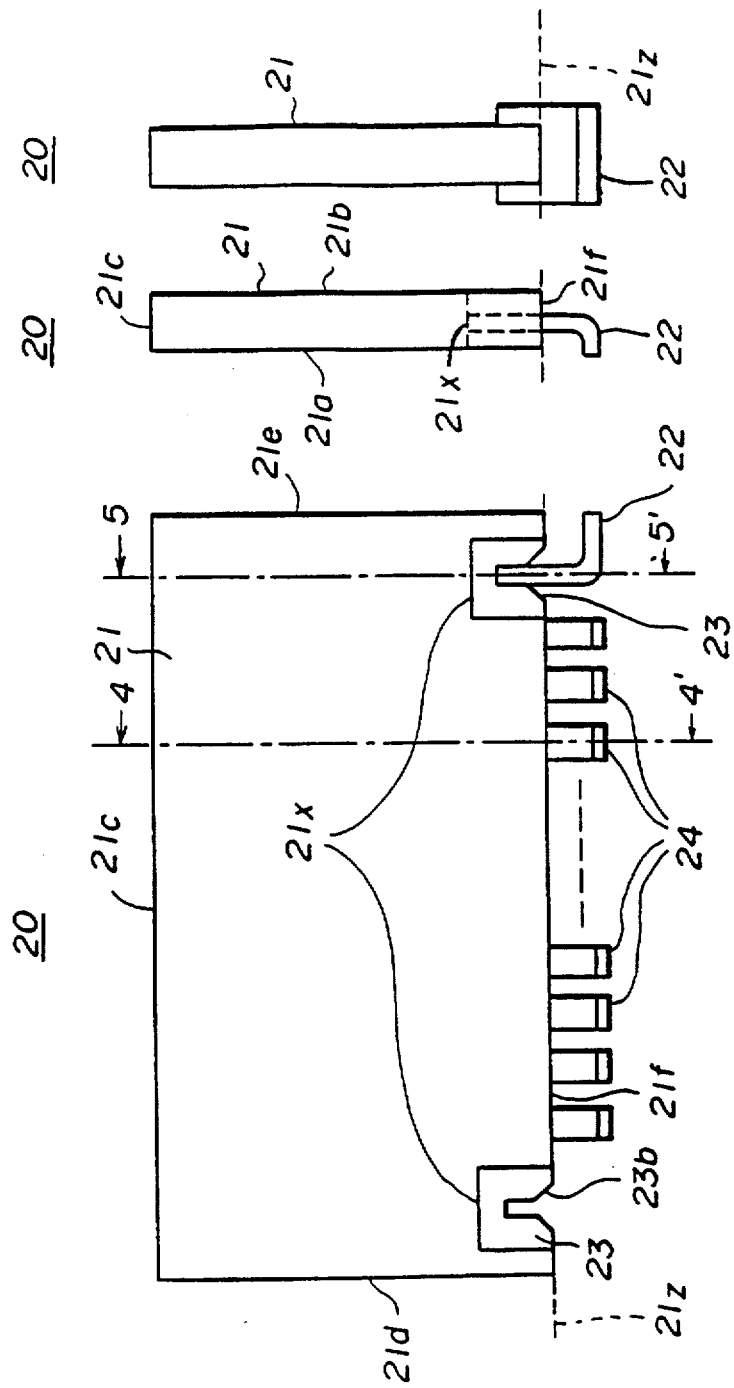

What is claimed is:

1. A method for mounting a semiconductor package on a substrate, said semiconductor package body having a flat shape defined by a pair of opposing major surfaces and which are interconnected by an elongated edge of said package body comprising the steps of:

providing a support member for engagement with a body of a semiconductor package and extending from the package body, said support member having a planar end surface and being adapted for holding said package body in a substantially upright orientation relatively to, and when the planar end surface of the support member is placed upon, a substantially horizontally oriented main surface of a substrate;

placing said package body, in said upright orientation, in engagement with the support member and supported by said support member on a substantially horizontally oriented main surface of a substrate, by inserting an upper portion of said support member into an engaging part formed in the elongated edge of said package body, said package body having interconnection leads extending therefrom and said substrate having a solder pattern thereon engaged by the interconnection leads of the package body when engaged with and supported by the support member on the main surface of the substrate; and causing a reflow of the solder pattern provided on said substrate to establish a mechanical connection and an electrical contact between said solder pattern and the interconnection leads of said package body.

2. A method for mounting a semiconductor package on a substrate, said semiconductor package body having a flat shape defined by a pair of opposing major surfaces and which are interconnected by an elongated edge of said package body, comprising the steps of:

providing a support member for engagement with a body of a semiconductor package and extending from the package body, said support member having a planar end surface and being adapted for holding said package body in a substantially upright orientation relatively to, and when the planar end surface of the support member is placed upon, a substantially horizontally oriented main surface of a substrate;

placing said package body, in said upright orientation, in engagement with the support member and supported at said support member on a substantially horizontally oriented main surface of a substrate, including inserting an upper portion of the support member into a mating slot provided in an exposed portion of a lead frame of the semiconductor package body, exposed along the elongated edge and extending inwardly of the package body from the elongated edge, for engaging the support member with the semiconductor package body, said package body having interconnection leads extending therefrom and said substrate having a solder pattern thereon engaged by the interconnection leads of the package body when engaged with and supported by the support member on the main surface of the substrate; and causing a reflow of the solder pattern provided on said substrate to establish a mechanical connection and an electrical contact between said solder pattern and the interconnection leads of said package body.

3. A method for mounting a semiconductor package on a substrate, said semiconductor package body having a flat shape defined by a pair of opposing major surfaces and which are interconnected by an elongated edge of said package body, the elongated edge comprising a vertical edge of the package body having a notch therein, comprising the steps of:

provided a support member for engagement with a body of a semiconductor package and extending from the package body, said support member having a planar end surface and being adapted for holding said package body in a substantially upright orientation relatively to, and when the planar end surface of the support member is placed upon, a substantially horizontally oriented main surface of a substrate;

placing said package body, in said upright orientation, in engagement with the support member and supported by said support member on a substantially horizontally oriented main surface of a substrate, including inserting an upper end of the support member, which extends transversely of the vertical elongated edge, into the notch for engaging the support member with the semiconductor package body, said package body having interconnection leads extending therefrom and said substrate having a solder pattern thereon engaged by the interconnection leads of the package body when engaged with and supported by the support member on the main surface of the substrate; and causing a reflow of the solder pattern provided on said substrate to establish a mechanical connection and an electrical contact between said solder pattern and the interconnection leads of said package body.

4. A method for mounting plural semiconductor packages on a substrate, comprising the steps of:

providing a support member for engagement with plural bodies of plural semiconductor packages and so as to extend from the package bodies, said support member and having a planar end surface and being adapted for holding said plural package bodies in parallel relationship and in substantially upright orientations relatively to, and when the planar end surface of the support member is placed upon, a substantially horizontally oriented main surface of a substrate;

placing said plural package bodies, in said upright orientations, in engagement with the support member and supported by the support member on a substantially horizontally oriented main surface of a substrate, said package bodies having interconnection leads extending therefrom and said substrate having plural solder patterns thereon, each solder pattern engaged by the interconnection leads of the package body when engaged with and supported by the support member on the main surface of the substrate; and causing a reflow of the solder pattern provided on said substrate to establish a mechanical connection and an electrical contact between said solder patterns and the interconnection leads of said plural package bodies.

5. A method as claimed in claim 4, wherein each of said semiconductor package bodies has a flat shape defined by a pair of opposing major surfaces and which are interconnected by an elongated edge of said package body, and wherein said step of engaging said plural package bodies with the support member further comprises inserting an upper portion of said support member into corresponding engaging parts formed in the respective elongated edges of said plural package bodies.

6. A method for mounting a semiconductor package on a substrate, the semiconductor package having a body, defined by a pair of opposing major surfaces and a surrounding sidewall connecting the pair of opposing major surfaces and defining a substantially planar bottom edge, and a plurality of interconnection leads, extending in parallel relationship and substantially transversely, by a common first distance, from the bottom edge and bent to define laterally extending end portions lying in a common plane substantially parallel to the bottom edge, comprising the steps of:

providing first and second support members adapted for engagement with the body of the semiconductor package, such that the first and second support members are spaced by a fixed distance when engaged with the body of the semiconductor package and extend therefrom, substantially transversely relatively to the bottom edge, and have corresponding end portions lying in the common plane so as to be received on a substantially horizontally oriented main surface of the substrate, the common plane and the substrate main surface having a substantially planar interface therebetween;

placing said package body, in said upright orientation and in engagement with and supported by said first and second support members, on a substantially horizontally oriented main surface of the substrate and with the interconnection leads engaging a solder pattern provided on the main surface of the substrate, including placing the end portions of the first and second support members on the substantially horizontally oriented main surface of the substrate, at first and second locations spaced apart by the fixed distance, prior to placing said package body in said upright orientation and in engagement with and supported by said first and second support members on the substantially horizontally oriented main surface of the substrate; and causing a reflow of the solder pattern, provided on the main surface of said substrate, to establish a mechanical connection and an electrical contact between said solder pattern and the interconnection leads of said package body.

7. A method for mounting a semiconductor package on a substrate, the semiconductor package having a body defined by a pair of opposing major surfaces and a surrounding sidewall connecting the pair of opposing major surfaces and defining a substantially planar bottom edge, and a plurality of interconnection leads extending in parallel relationship and Substantially transversely, by a common first distance, from the bottom edge and bent to define laterally extending end portions lying in a common plane substantially parallel to the bottom edge, comprising the steps of:

providing first and second support members adapted for engagement with the body of the semiconductor package, such that the lateral end portions of the interconnection leads extend transversely to the major surfaces of the package body, and extend therefrom, substantially transversely relatively to the bottom edge, and have corresponding end portions lying in the common plane so as to be received on a substantially horizontally oriented main surface of the substrate, the common plane and the substrate main surface having a substantially planar interface therebetween;

placing said package body, in said upright orientation and in engagement with and supported by said first and second support members, on a substantially horizontally oriented main surface of the substrate and with the interconnection leads engaging a solder pattern provided on the main surface of the substrate, including forming the respective end portions of the first and second support members so as to extend in the common plane in a direction corresponding to the direction of the substantially planar bottom edge of the package body and to have a width dimension, transverse to the major surfaces of the package body, which is greater than a corresponding thickness dimension defined by the pair of opposing major surfaces of the package body; and causing a reflow of the solder pattern, provided on the main surface of said substrate, to establish a mechanical connection and an electrical contact between said solder pattern and the interconnection leads of said package body.

8. A method for mounting a semiconductor package having opposed major surfaces and a surrounding sidewall connecting the pair of opposed major surfaces and a pattern of plural interconnection leads extending from a first portion of the surrounding sidewall, the semiconductor package further having a cutout therein, extending inwardly of a corresponding portion of the surrounding sidewall and exposing a portion of a lead frame disposed within the package body, comprising the steps of:

providing a support member having an engaging portion engageable with the exposed lead frame portion and a planar supporting portion adapted for engaging a corresponding planar portion of a substantially horizontally oriented main surface of a substrate, the substrate having a solder pattern on the main surface thereof corresponding to the pattern of the interconnection leads; and supporting the package body in an upright orientation on the substantially horizontally oriented main surface of the substrate by assembling the engaging portion of the support member with the exposed lead frame portion and disposing the support portion of the support member on the main surface of the substrate and with the interconnection leads extending from the package and engaging the solder pattern on the main surface of the substrate.

9. A method as claimed in claim 8, wherein the mounting step comprises assembling the engaging portion of the support member with the exposed lead frame portion and, thereafter, placing the package body, as assembled with the support member and in the upright orientation, onto the main surface of the substrate such that the planar support portion of the support member engages the main surface of the substrate.

10. A method as claimed in claim 8, wherein the cutout is formed in a bottom edge portion of the package and the engaging portion of the support member extends in a substantially upright orientation from the main surface of the substrate.

11. A method as claimed in claim 8, wherein the exposed lead frame portion has a slot therein and the engaging portion of the support member is of a complementary, generally planar configuration receivable in the slot and the step of engaging the support member with the package body comprises inserting the engaging portion of the support member into the slot of the exposed lead frame portion.

12. A method as claimed in claim 8, wherein the surrounding sidewall comprise a portion thereof disposed in a substantially upright orientation relative to the substantially horizontally oriented main surface of the substrate; and the engaging portion of the support member extends transversely to the upright portion of the surrounding sidewall and parallel to the substantially horizontally oriented main surface of the substrate and the assembling of the engaging portion of the support member with the exposed lead frame portion further comprises inserting the engaging portion into the slot of the exposed lead frame portion by relatively moving the package body and the support member together, in a direction toward each other and parallel to the main surface of the substrate.

* * * * *

UNITED STATES PATENT AND TRADEMARK OFFICE
CERTIFICATE OF CORRECTION

PATENT NO. : 5,728,601  
DATED : Mar. 17, 1998  
INVENTOR(S) : SATO et al.

Page 1 of 5

It is certified that error appears in the above-identified patent and that said Letters Patent is hereby corrected as shown below:

TITLE PAGE:
Replace the Title Page with the attached, corrected Title Page.

In the Drawings:

Replace Sheet 3 of 8 (FIGS. 4(A)-4(C)), Sheet 5 of 8 (FIGS. 6(A)-6(D)) and Sheet 7 of 8 (FIGS. 8(A) and 8(B)) with the attached, corrected drawings.

Col. 5, line 54, after "device" insert --20--.

Col. 8, line 6 (Claim 1, line 5), after "body" insert --,--;  
line 46 (Claim 2, line 15), change "supported at" to --supported by--.

Col. 10, line 45 (Claim 7, line 7), change "Substantially" to --substantially--.

Signed and Sealed this

First Day of February, 2000

Attest:

*Attesting Officer*

Q. TODD DICKINSON

*Acting Commissioner of Patents and Trademarks*

United States Patent [19]
Sato et al.

[11] Patent Number: 5,728,601
[45] Date of Patent: Mar. 17, 1998

[54] PROCESS FOR MANUFACTURING A SINGLE IN-LINE PACKAGE FOR SURFACE MOUNTING

[75] Inventors: Mitsutaka Sato; Masanori Yoshimoto, both of Kawasaki, Japan

[73] Assignee: Fujitsu Limited, Kawasaki, Japan

[21] Appl. No.: 441,595

[22] Filed: May 15, 1995

Related U.S. Application Data

[62] Division of Ser. No. 26,809, Mar. 5, 1993, Pat. No. 5,446,317.

[30] Foreign Application Priority Data

Mar. 9, 1992 [JP] Japan ................................. 4-050941

[51] Int. Cl.$^6$ .................... H01L 21/56; H01L 21/58; H01L 21/60
[52] U.S. Cl. .................... 437/208; 437/211; 437/217
[58] Field of Search ................ 437/211, 217, 437/208, 915; 257/696, 678, 701, 733, 731, 732; 361/772, 783, 807

[56] References Cited

U.S. PATENT DOCUMENTS

| | | |
|---|---|---|
| Re. 34,794 | 11/1994 | Farnworth ........................... 257/678 |
| 2,734,151 | 2/1956 | Jacobs ............................... 361/776 |
| 4,764,846 | 8/1988 | Go .................................... 361/388 |
| 4,975,763 | 12/1990 | Baudouin et al. ................... 257/701 |
| 5,204,287 | 4/1993 | McLellan et al. .................. 257/676 |
| 5,260,601 | 11/1993 | Baudouin et al. ................... 257/733 |
| 5,275,975 | 1/1994 | Baudouin et al. ................... 437/209 |
| 5,413,970 | 5/1995 | Russell .............................. 437/217 |
| 5,451,815 | 9/1995 | Taniguchi et al. .................. 257/731 |

FOREIGN PATENT DOCUMENTS

| | | | |
|---|---|---|---|
| 333374 | 9/1989 | European Pat. Off. ........... 257/733 |
| 61-174656 | 8/1986 | Japan . |
| 62-076659 | 4/1987 | Japan . |
| 01-166545 | 6/1989 | Japan . |

*Primary Examiner*—David Graybill
*Attorney, Agent, or Firm*—Staas & Halsey

[57] ABSTRACT

A process for manufacturing semiconductor package of a single in-line type including a semiconductor chip, a package body for accommodating the semiconductor chip and a plurality of leads held by the package body to extend substantially perpendicularly to a bottom edge surface of the package body. The package body carries a cutout part at a predetermined position of a side edge that surrounds the package body such that the cutout part is adapted for engagement with a support leg for supporting the package body substantially upright on a substrate.

12 Claims, 8 Drawing Sheets